United States Patent
Ahn et al.

(10) Patent No.: US 9,297,831 B2
(45) Date of Patent: Mar. 29, 2016

(54) TOUCH SENSOR USING GRAPHENE FOR SIMULTANEOUSLY DETECTING A PRESSURE AND A POSITION

(75) Inventors: Jong-Hyun Ahn, Suwon-si (KR); Byung Hee Hong, Seoul (KR); Young Bin Lee, Suwon-si (KR); Su Kang Bae, Suwon-si (KR); Hyeong Keun Kim, Hwaseong-si (KR)

(73) Assignee: Graphene Square, Inc., Seoul (KR)

( * ) Notice: Subject to any disclaimer, the term of this patent is extended or adjusted under 35 U.S.C. 154(b) by 206 days.

(21) Appl. No.: 13/997,566

(22) PCT Filed: Dec. 23, 2011

(86) PCT No.: PCT/KR2011/010038
§ 371 (c)(1),
(2), (4) Date: Jun. 24, 2013

(87) PCT Pub. No.: WO2012/087065
PCT Pub. Date: Jun. 28, 2012

(65) Prior Publication Data
US 2013/0285970 A1    Oct. 31, 2013

(30) Foreign Application Priority Data
Dec. 24, 2010  (KR) .......................... 10-2010-0134801

(51) Int. Cl.
*G06F 3/041*  (2006.01)
*G01R 1/06*  (2006.01)
*G06F 3/044*  (2006.01)
*G06F 3/045*  (2006.01)

(52) U.S. Cl.
CPC .................. *G01R 1/06* (2013.01); *G06F 3/041* (2013.01); *G06F 3/044* (2013.01); *G06F 3/045* (2013.01); *G06F 2203/04103* (2013.01); *G06F 2203/04106* (2013.01)

(58) Field of Classification Search
USPC .................................. 345/173–178; 324/705
See application file for complete search history.

(56) References Cited

U.S. PATENT DOCUMENTS

| | | | | |
|---|---|---|---|---|
| 5,877,425 A | * | 3/1999 | Suzuki et al. | .................... 73/727 |
| 5,915,285 A | | 6/1999 | Sommer | |
| 2002/0008818 A1 | * | 1/2002 | Shiota | ........................... 349/138 |
| 2006/0092139 A1 | | 5/2006 | Sharma | |

(Continued)

FOREIGN PATENT DOCUMENTS

| | | |
|---|---|---|
| EP | 2 133 777 A2 | 12/2009 |
| JP | 2010-244514 A | 10/2010 |

(Continued)

OTHER PUBLICATIONS

Int'l. Search Report issued in Int'l. App. No. PCT/KR2011/010038, mailed Jul. 31, 2012.

(Continued)

*Primary Examiner* — Jason Olson
*Assistant Examiner* — Sosina Abebe
(74) *Attorney, Agent, or Firm* — Greer Burns & Crain Ltd.

(57) ABSTRACT

A touch sensor capable of specifying a touch position and/or a degree of a touch pressure by using graphene as an electrode and/or a strain gauge, and more particular, a touch sensor capable of simultaneously detecting a pressure and a position by means of change in resistance by using graphene is provided.

6 Claims, 10 Drawing Sheets

(56) References Cited

U.S. PATENT DOCUMENTS

| | | | |
|---|---|---|---|
| 2008/0048996 A1 | 2/2008 | Hu et al. | |
| 2008/0179173 A1* | 7/2008 | Jung | H01H 13/83 200/314 |
| 2008/0180614 A1* | 7/2008 | Yoon | 349/114 |
| 2009/0237374 A1 | 9/2009 | Li et al. | |
| 2009/0284398 A1 | 11/2009 | Shen et al. | |
| 2010/0007619 A1 | 1/2010 | Jiang et al. | |
| 2010/0050784 A1* | 3/2010 | Joung | 73/862.046 |
| 2010/0140723 A1* | 6/2010 | Kurtz | B82Y 10/00 257/415 |
| 2010/0225662 A1* | 9/2010 | Nakayama | G06F 3/0488 345/589 |
| 2010/0302172 A1* | 12/2010 | Wilairat | G06F 3/04883 345/173 |
| 2010/0304131 A1* | 12/2010 | Okai et al. | 428/333 |
| 2011/0006302 A1* | 1/2011 | Yamazaki et al. | 257/43 |
| 2011/0163298 A1* | 7/2011 | Sung | G03H 1/02 257/29 |
| 2012/0319976 A1* | 12/2012 | Ahn et al. | 345/173 |

FOREIGN PATENT DOCUMENTS

| | | |
|---|---|---|
| KR | 10-2009-0098351 A | 8/2009 |
| KR | 10-2009-0105448 A | 10/2009 |
| KR | 10-2010-0019808 A | 2/2010 |
| KR | 10-2010-0022747 | 3/2010 |

OTHER PUBLICATIONS

Jong-Hyun Ahn; "Graphene Transparent Electrode"; The Korean Information Display Society; 2010, vol. 11. No. 5; pp. 33-37.

EP Search Report issued in counterpart EP App. No. 11852000.6, mailed May 20, 2015.

F. Bonaccorso et al., "Graphene photonics and optoelectronics", Nature Photonics, vol. 4, No. 9, Aug. 31, 2010, pp. 611-622.

J. A. Pickering, "Touch-sensitive screens: the technologies and their application", International Journal of Man-Machine Studies, vol. 25, No. 3, Sep. 1, 1986, pp. 249-269.

Sukang Bae et al., "Roll-to-roll production of 30-inch graphene films for transparent electrodes", Nature Nanotechnology, vol. 5, No. 8, Aug. 1, 2010, pp. 574-578.

Sukang Bae et al., "Supplementary information Roll-to-roll production of 30-inch graphene films for transparent electrodes", Nature Nano Lechnology, vol. 5, No. 8, Jun. 20, 2010, pp. 574-578.

\* cited by examiner graphene strain gauge array

TOUCH SENSOR USING GRAPHENE FOR SIMULTANEOUSLY DETECTING A PRESSURE AND A POSITION

CROSS-REFERENCE TO RELATED APPLICATION

This application is a U.S. National Phase under 35 U.S.C. §371 of International Application No. PCT/KR2011/010038 filed on Dec. 23, 2011.

TECHNICAL FIELD

The present disclosure relates to a touch sensor capable of simultaneously measuring a pressure and a position by using graphene by means of change in resistance.

BACKGROUND ART

In touch sensors such as a touch screen and a touch pad, input is made by contact of a finger, a pen, or the like onto a screen, without using input devices such as a keyboard or a mouse. Although a touch screen needs to be improved with respect to accuracy, an input speed, input of characters, and so on, it is advantageous in that it enables anybody to easily make input. Thus, the touch screen has been conventionally used in public sectors such as an automated teller machine, Kiosk, and the like. However, with the recent development of the mobile communication technology, the touch screen has extended its function to means for simply displaying character information in electronic information devices such as mobile phones, PDAs, and navigation systems, and furthermore, means for providing more various and complicated multi-media in audios, videos, and wireless internet web browser. As the multi-media function is developed, realization of a larger display screen within a restricted size of an electronic information device is being demanded. Accordingly, a display using a touch panel is being more spotlighted.

Since a touch display formed by stacking a touch panel on a liquid crystal display integrates a screen and a coordinate input means, it is advantageous in reduction of space, compared to a conventional key input type. Accordingly, since an electronic information device, to which the touch display is applied, can increase a screen size and improve user convenience, the use of the touch panel is being increased.

To briefly review detection types, there are a resistive type, which detects a position pressed by a pressure by means of change in a current or voltage value in the state that a DC voltage is applied, a capacitive type, which uses capacitance coupling in the state that an AC voltage is applied, and an electromagnetic type, which detects a selected position by means of change in a voltage in the state that a magnetic field is applied.

The resistive type is combined with a liquid crystal display device to be adopted for personal mobile devices, navigation systems, PMPs, electronic notebooks, PDAs, and so on. The resistive type of a touch panel is divided into an analogue type and a digital type depending on a method of detecting a touch point. Korean Patent Application Publication No. 2008-0108277 describes a method for production of a resistive touch sensor using ultrasonic wave fusion.

As described above, various types of touch screens are being provided in various devices. However, there are problems that should be solved for reduction of costs and improvement of performance. That is, a touch screen device having a more simplified structure and a more improved performance is demanded. Further, conventional touch screen devices have a problem in that it is difficult to realize large size screens.

DISCLOSURE OF THE INVENTION

Problems to Be Solved by the Invention

The present disclosure provides a touch sensor capable of specifying a touch position and/or a degree of a touch pressure by using graphene as an electrode and/or a strain gauge, and more particular, a touch sensor capable of simultaneously detecting a pressure and a position by means of change in resistance by using graphene.

However, the problems to be solved by the present disclosure may not be limited to those described above. Other problems, which are sought to be solved by the present disclosure but are not described in this document, can be clearly understood by those skilled in the art from the disclosures below.

Means for Solving the Problems

In accordance with a first aspect of the present disclosure, there is provided a touch sensor for simultaneously detecting a pressure and a position, including: first graphene electrode patterns formed on a first substrate and including a plurality of graphene electrodes formed in parallel with one another; a force sensing resistor (FSR) layer formed on the first graphene electrode patterns; second graphene electrode patterns formed on a second substrate, vertically crossing the first graphene electrode patterns, and including a plurality of graphene electrodes formed in parallel with one another; and a controller that applies a voltage to the first graphene electrode patterns and the second graphene electrode patterns, and senses change in resistance of the force sensing resistor according to a pressure applied by an outside touch on the first substrate or the second substrate to determine X and Y coordinates of the position of the outside touch and senses a degree of the pressure applied by the outside touch.

In accordance with a second aspect of the present disclosure, there is provided a display panel having a touch sensor for simultaneously detecting a pressure and a position including: a display panel; and a touch sensor for simultaneously detecting a pressure and a position in accordance with the first aspect of the present disclosure, wherein the touch sensor is attached to a front surface of the display panel.

In accordance with a third aspect of the present disclosure, there is provided a touch sensor for simultaneously detecting a pressure and a position, including: a first substrate formed on a first insulating substrate and including first graphene patterns including a plurality of graphene electrodes formed in parallel with one another; a second substrate formed on a second insulating substrate and including second graphene patterns vertically crossing the first graphene patterns and including a plurality of graphene electrodes formed in parallel with one another; and a controller that applies a voltage to the first graphene patterns and the second graphene patterns, and senses change in resistance generated in at least one graphene electrode of the first graphene patterns and at least one graphene electrode of the second graphene patterns according to a pressure applied by an outside touch on the first or second insulating substrate to determine X and Y coordinates of the position of the outside touch and senses a degree of the pressure applied by the outside touch.

In accordance with a fourth aspect of the present disclosure, there is provided a display panel having a touch sensor for simultaneously detecting a pressure and a position including: a display panel; and a touch sensor for simultaneously detecting a pressure and a position in accordance with the third aspect of the present disclosure, wherein the touch sensor is attached to a front surface of the display panel.

In accordance with a fifth aspect of the present disclosure, there is provided a touch sensor for simultaneously detecting a pressure and a position, including: first graphene electrode patterns formed on an insulating substrate and including a plurality of graphene line electrodes formed in parallel with one another, and second graphene electrode patterns formed on the first graphene electrode patterns and including a plurality of graphene line electrodes vertically crossing the respective plurality of the graphene line electrodes of the first graphene electrode patterns and formed in parallel with one another; a plurality of graphene strain gauges formed to be connected to respective crossing points between the plurality of the graphene line electrodes of the first graphene electrode patterns and the plurality of the graphene line electrodes of the second graphene electrode pattern; and a controller that applies a voltage to each of the graphene line electrodes of the first graphene electrode patterns and the second graphene electrode patterns, and senses change in resistance generated in the graphene strain gauges corresponding to a position of an outside touch on the insulating substrate according to a pressure applied by the outside touch to determine X and Y coordinates of the position of the outside touch and senses a degree of the pressure applied by the outside touch.

In accordance with a sixth aspect of the present disclosure, there is provided a display panel having a touch sensor for simultaneously detecting a pressure and a position, including: a display panel; and a touch sensor for simultaneously detecting a pressure and a position in accordance with the fifth aspect of the present disclosure, wherein the touch sensor is attached to a front surface of the display panel.

In accordance with a seventh aspect of the present disclosure, there is provided a display panel having a touch sensor for simultaneously detecting a pressure and a position, including: a lower substrate provided with a transparent conductive film, an electrode and dot spacers; an upper substrate provided with a transparent conductive film and an electrode; a graphene electrode formed on the electrode included in the upper substrate and/or the electrode included in the lower substrate and having a function of sensing strain; and an adhesive for adhering the lower substrate and the upper substrate to be facing to each other with a certain interval, wherein the display panel includes a wiring structure for input and output of a signal from the electrode of the upper substrate and the electrode of the lower substrate to the outside.

In accordance with a eighth aspect of the present disclosure, there is provided a display panel having a touch sensor for simultaneously detecting a pressure and a position, including: an upper substrate provided with a transparent conductive film; a lower substrate provided with a transparent conductive film; a graphene electrode formed between the upper substrate and the transparent conductive films; an electrode formed on a side surface of the graphene electrode; and an insulating coating portion for insulating a lower part of the transparent conductive film of the lower substrate, wherein when a top surface of the transparent conductive film is touched, the position of the touch is sensed by the electrode formed on the side surface according to variation of electrostatic capacitance, and a degree of the pressure by the touch is sensed by using the function of the graphene electrode itself to sense strain.

Effect of the Invention

According to the present disclosure, a multi-touch function can be realized by applying X-axis and Y-axis graphene electrodes patterned and formed on a substrate to a touch sensor. When electrodes are manufactured by using graphene, a problem caused from misalignment can be prevented or minimized. Further, uniformity and reproducibility of the products can be easily achieved. Since the graphene has excellent transparency and mechanical property, it can be used for a transparent, flexible, and stretchable touch sensor. Accordingly, the sensor of the present disclosure can also be applied as a stretchable 3D sensor.

BEST MODE FOR CARRYING OUT THE INVENTION

Figure 1:
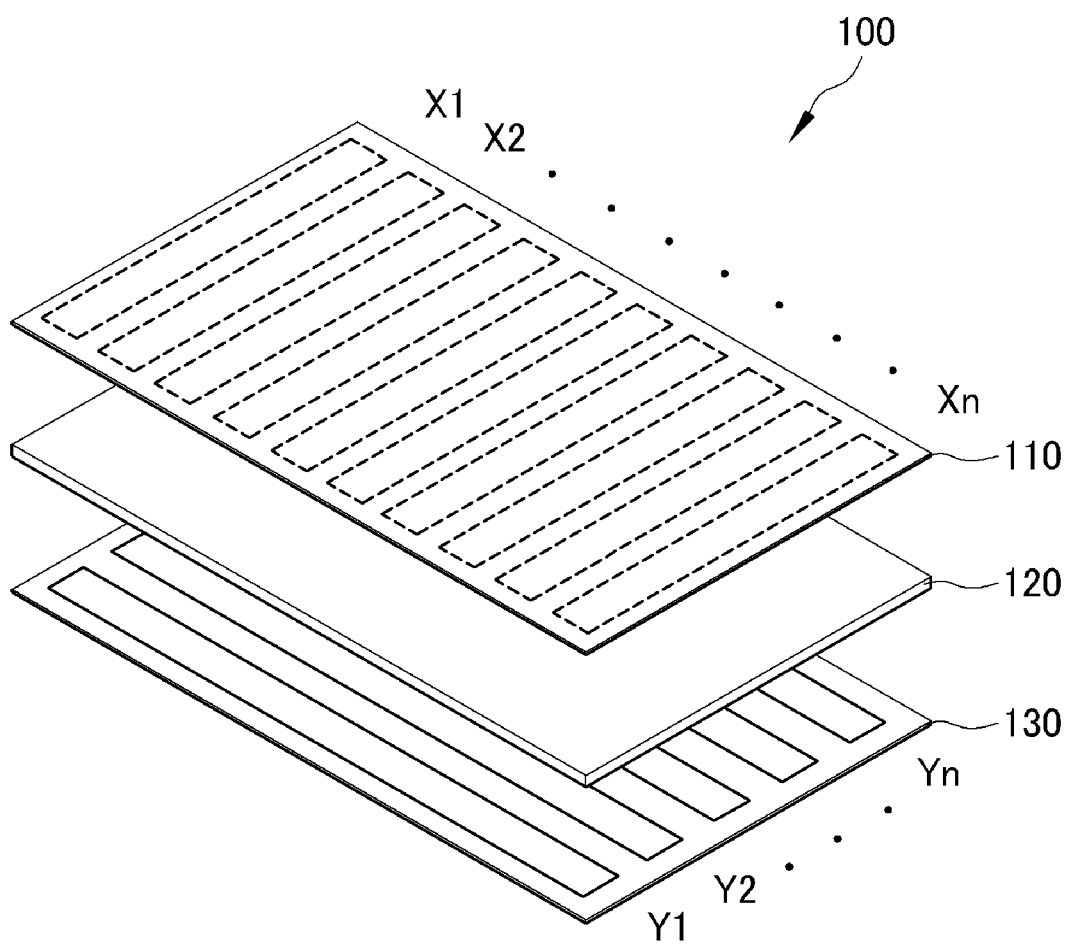
FIG. 1 is an exploded perspective view schematically illustrating a touch sensor for simultaneously detecting a pressure and a position in accordance with an illustrative embodiment of the present disclosure.

Hereinafter, illustrative embodiments and examples of the present disclosure will be described in detail with reference to the accompanying drawings so that inventive concept may be readily implemented by those skilled in the art.

However, it is to be noted that the present disclosure may not be limited to the illustrative embodiments and the examples but can be realized in various other ways. In the drawings, certain parts not directly relevant to the description are omitted to enhance the clarity of the drawings, and like reference numerals denote like parts throughout the whole document.

Throughout the whole document, the term "comprises or includes" and/or "comprising or including" used in the document means that one or more other components, steps, operations, and/or the existence or addition of elements are not excluded in addition to the described components, steps, operations and/or elements. The terms "about or approximately" or "substantially" are intended to have meanings close to numerical values or ranges specified with an allowable error and intended to prevent accurate or absolute numerical values disclosed for understanding of the present invention from being illegally or unfairly used by any unconscionable third party. Through the whole document, the term "step of" does not mean "step for".

A first aspect of the present disclosure can provide a touch sensor for simultaneously detecting a pressure and a position, including: first graphene electrode patterns formed on a first substrate and including a plurality of graphene electrodes formed in parallel with one another; a force sensing resistor (FSR) layer formed on the first graphene electrode patterns; second graphene electrode patterns formed on a second substrate, vertically crossing the first graphene electrode patterns, and including a plurality of graphene electrodes formed in parallel with one another; and a controller that applies a voltage to the first graphene electrode patterns and the second graphene electrode patterns, and senses change in resistance of the force sensing resistor according to a pressure applied by an outside touch on the first substrate or the second substrate to determine X and Y coordinates of the position of the outside touch and senses a degree of the pressure applied by the outside touch.

In an illustrative embodiment, at least one of the first substrate and the second substrate may be flexible or stretchable, but may not be limited thereto. For example, since the graphene electrodes are flexible and stretchable, at least one of the first substrate and the second substrate may be formed of a flexible and stretchable material so that a flexible and stretchable touch sensor can be manufactured. At least one of the first substrate and the second substrate may be formed of plastic or rubber, but may not be limited thereto.

In an illustrative embodiment, the first substrate and the second substrate may include a transparent organic insulator, but may not be limited thereto. For example, the transparent organic insulator may include one selected from the group consisting of polyimide (PI), polyacryl, thermosetting resins such as polyphenol, polyester, silicone and polyurethane, thermoplastic resins such as polycarbonate, polyethylene and polystyrene, benzocyclobutene (BCB), F-added polyimide (PI), perfluorocyclobutane (PFCB), fluoropolyarylether (FPAE), a siloxane-based polymer, SOG and a combination thereof.

In an illustrative embodiment, the force sensing resistor layer may include a transparent conductive film, but may not be limited thereto. Since the transparent conductive film has an excellent bending property in addition to excellent electrical conductivity and transparency, if each of the first and second force sensing resistor layers is formed of the transparent conductive film, it is possible to provide a conductivity-improved film, which is applicable as a material for a transparent electrode and a touch screen of a flat panel display. In an illustrative embodiment, each of the first and second force sensing resistor layers may be formed of a piezoelectric material, but may not be limited thereto. For the piezoelectric material, any piezoelectric material known in the art may be used without limitation.

In an illustrative embodiment, the force sensing resistor layer may include at least one force sensing resistor layer, but may not be limited thereto.

In an illustrative embodiment, the controller alternatively applies a voltage only to the graphene electrodes of the first graphene electrode patterns and the graphene electrodes of the second graphene electrode patterns at the position, to which the outside touch is applied, to determine X and Y coordinates of the position of the outside touch and simultaneously determine a degree of the pressure applied by the outside touch. However, the controller may not be limited thereto.

FIG. 1 is an exploded perspective view schematically illustrating configuration of the touch sensor for simultaneously detecting a pressure and a position in accordance with an illustrative embodiment of the present disclosure.

With reference to FIG. 1, a touch sensor 100 for simultaneously detecting a pressure and a position in accordance with an illustrative embodiment of the present disclosure may include a first substrate 110, a force sensing resistor (FSR) layer 120, and a second substrate 130. The touch sensor 100 may further include first graphene electrode patterns (X1, X2 . . . Xn) patterned and formed on the first substrate 110 and second graphene electrode patterns (Y1, Y2 . . . Yn) patterned and formed on the second substrate 130.

The touch sensor 100 for simultaneously detecting a pressure and a position may be configured to include the first substrate 110 and the second substrate 130 facing to the first substrate 110. The first substrate 110 is a member, to which an outside pressure F by a pointing object (e.g., a finger, a stylus pen, and so on) is applied, and which is strained by the outside pressure F. In the touch panel 100 of the present disclosure, the first substrate 110 may be formed of a transparent material to provide a display screen to a user. For example, the transparent material may include glass, quartz, an acrylic panel, a transparent film, a plastic substrate, and others. The upper substrate may be formed of a material, which can be restored after the outside pressure F by the pointing object is applied.

The second substrate 130 is spaced in a certain distance from the first substrate 110 and may be formed of a transparent material like the first substrate 110. The spacing between the first substrate 110 and the second substrate 130 may be, for example, approximately 0.01 µm to approximately 100 µm. If the spacing is below approximately 0.01 µm, change of the spacing resulting from the straining of the first substrate 110 cannot be sufficiently responded. If the spacing exceeds approximately 100 µm, it would be an obstacle to minimization in size. With the spacing between the first substrate 110 and the second substrate 130, durability of the touch screen is improved. Further, it is possible to provide the screen stable to an external shock and the clean screen to users.

The first substrate 110 is coated with the first graphene electrode patterns (X1, X2 . . . Xn) including the multiple graphene electrodes formed in parallel with one another along the direction of the X axis on the first substrate 110. The second substrate 130 is coated with the second graphene electrode patterns (Y1, Y2 . . . Yn) vertically crossing the direction of the X axis of the first graphene patterns (X1, X2 . . . Xn) and including the multiple graphene electrodes formed in parallel with one another along the direction of the Y axis of the second substrate 130.

The touch sensor 100 for simultaneously detecting a pressure and a position may include a force sensing resistor layer 120 for sensing change in a pressure between the first graphene electrode patterns (X1, X2 . . . Xn) formed on the first substrate 110 and the second graphene electrode patterns (Y1, Y2 . . . Yn) formed on the second substrate 130. The force sensing resistor layer 120 functions as a layer sensing a pressure. In the force sensing resistor layer 120, when a force applied to a sensor surface increases, descending resistance is generated. This may be ideal for sensing a pressure.

When a touch occurs on the surface of the touch sensor 100 for simultaneously detecting a pressure and a position, the first substrate 110 and the second substrate 130 are subject to change in resistance due to the applied outside pressure. A sensing circuit (not illustrated) measures a pressure by evaluating a degree of the applied pressure by means of a degree of a current depression resulting from the change in the resistance of the graphene caused by the applied outside pressure. In this case, functions may be differentiated depending on the degree of the pressure. For example, when a small force is applied, a zooming out function is performed. When a large force is applied, a zooming in function is performed. These functions can be realized by using the operation principle described above. In addition, a function may be added by using a value for a resistance generated when the applied pressure is maintained.

It is possible to sense a position by means of distribution of change in the magnitude of the resistance generated in each of the graphene electrode lines. A lead wire and a load resistance (RL) may be connected to an end part of each of the second graphene electrode patterns (Y1, Y2 . . . Yn) of the second substrate 130. In the first substrate 110, the first graphene electrode patterns (X1, X2 . . . Xn), which have been divided through patterning, may be formed in parallel with one another such that the first graphene electrode patterns (X1, X2 . . . Xn) and the second graphene electrode patterns (Y1, Y2 . . . Yn) vertically cross with one another. A voltage is applied to the first graphene electrode patterns (X1, X2 . . . Xn) and the second graphene electrode patterns (Y1, Y2 . . . Yn) such that each of the patterned electrodes is ON, and the other switches are OFF. In this way, a voltage is measured by applying a signal for detection of a position in order. In this case, when a touch occurs at a certain point on the first substrate 110 or the second substrate 130 through a pressure applied by an outside touch, a high signal is generated at the touch operated point of the force sensing resistor layer 120 such that the controller (not illustrated) can sense generated change in resistance to determine and detect X and Y coordinates of the position of the outside touch. That is, the touch point can be detected by obtaining line distribution of each of the first graphene electrode patterns (X1, X2 . . . Xn) and the second graphene electrode patterns (Y1, Y2 . . . Yn), which exhibit large change in resistance at the point where the first graphene electrode patterns (X1, X2 . . . Xn) and the second graphene electrode patterns (Y1, Y2 . . . Yn) cross with one another, by means of software.

In the touch sensor 100 for simultaneously detecting a pressure and a position in accordance with an illustrative embodiment of the present disclosure, the first graphene electrode patterns (X1, X2 . . . Xn) and the second graphene electrode patterns (Y1, Y2 . . . Yn) are patterned while being spaced from one another with certain intervals so that the electrodes are separated. Thus, even when touches simultaneously occur at two points, the electrodes are not electrically affected by one another. Accordingly, the multi-touch function can be realized.

The touch sensor 100 is advantageous in that it can form graphene as an electrode directly on the substrate. That is, after graphene in a plate shape is formed on a substrate for a touch screen, it can be patterned in a desired shape. Since graphene is easily etched by oxygen plasma ($O_2$ plasma), a fine graphene pattern in a desired shape can be obtained by using a top-down process such as photolithography or E-beam lithography. Thus, when the electrodes are manufactured by using graphene, a problem resulting from misalignment can be prevented or minimized. Uniformity and reproductively of the products can be easily achieved. In addition, since graphene has excellent transparency and mechanical property, it can be used for a transparent and stretchable touch sensor. The sensor of the present disclosure may be applied as a stretchable 3D sensor.

A second aspect of the present disclosure can provide a display panel having a touch sensor for simultaneously detecting a pressure and a position, including: a display panel; and a touch sensor for simultaneously detecting a pressure and a position in accordance with the first aspect of the present disclosure, wherein the touch sensor is attached to a front surface of the display panel.

In an illustrative embodiment, the display panel may be a liquid crystal display panel, but may not be limited thereto.

A third aspect of the present disclosure can provide a touch sensor for simultaneously detecting a pressure and a position, including: a first substrate formed on a first insulating substrate and including first graphene patterns including a plurality of graphene electrodes formed in parallel with one another; a second substrate formed on a second insulating substrate and including second graphene patterns vertically crossing the first graphene patterns and including a plurality of graphene electrodes formed in parallel with one another; and a controller that applies a voltage to the first graphene patterns and the second graphene patterns, and senses change in resistance generated in at least one graphene electrode of the first graphene patterns and at least one graphene electrode of the second graphene patterns according to a pressure applied by an outside touch on the first or second insulating substrate to determine X and Y coordinates of the position of the outside touch and senses a degree of the pressure applied by the outside touch.

In an illustrative embodiment, each of the multiple graphene electrodes of the first graphene pattern and the second graphene pattern functions as a strain gauge, such that the change in the resistance occurring from the contact of at least one graphene electrode of the first graphene patterns and at least one graphene electrode of the second graphene patterns due to the pressure applied by the outside touch is in proportion to the degree of the pressure applied by the outside touch. However, the present disclosure may not be limited thereto.

In an illustrative embodiment, the first insulating substrate and the second insulating substrate may include a transparent organic insulator, but may not be limited thereto.

In an illustrative embodiment, at least one of the first insulating substrate and the second insulating substrate may be flexible or stretchable, but may not be limited thereto. For example, since the graphene electrodes are flexible and stretchable, at least one of the first insulating substrate and the second insulating substrate may be formed of a flexible and stretchable material so that a flexible and stretchable touch sensor can be manufactured. At least one of the first substrate and the second substrate may be formed of plastic or rubber, but may not be limited thereto. For example, at least one of the first insulating substrate and the second insulating substrate is formed of rubber so as to manufacture the touch sensor for simultaneously detecting a pressure and a position in a glove form. Such a glove can be used as a touch sensor for simultaneously detecting a pressure and a position in various fields of medical care, experiments, and others.

In an illustrative embodiment, the controller may alternatively apply a voltage only to the graphene electrodes of the first graphene patterns and the graphene electrodes of the second graphene patterns at the position, to which the outside touch is applied, to determine X and Y coordinates of the position of the outside touch, but may not be limited thereto.

Figure 2:
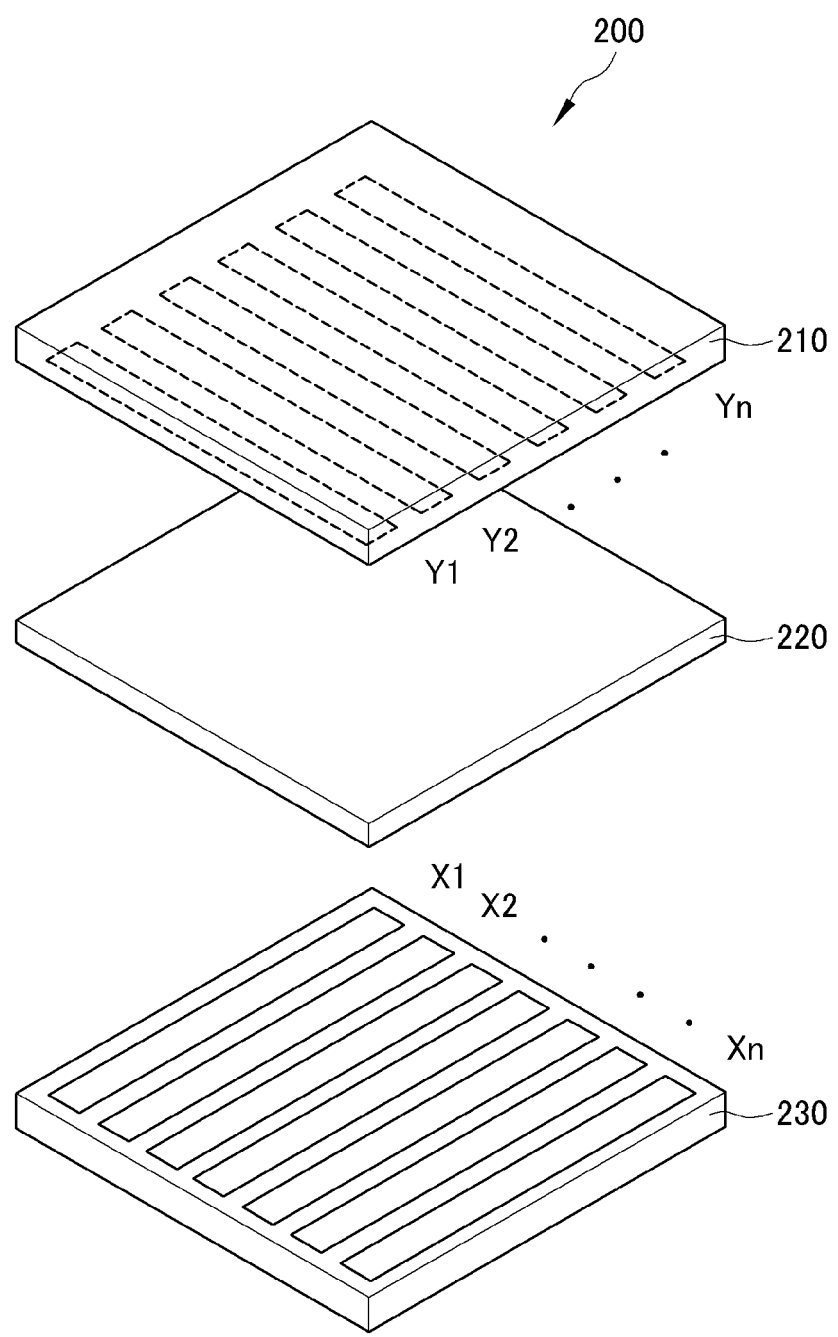
FIG. 2 is an exploded perspective view schematically illustrating a touch sensor for simultaneously detecting a pressure and a position in accordance with another illustrative embodiment of the present disclosure.
Figure 3:
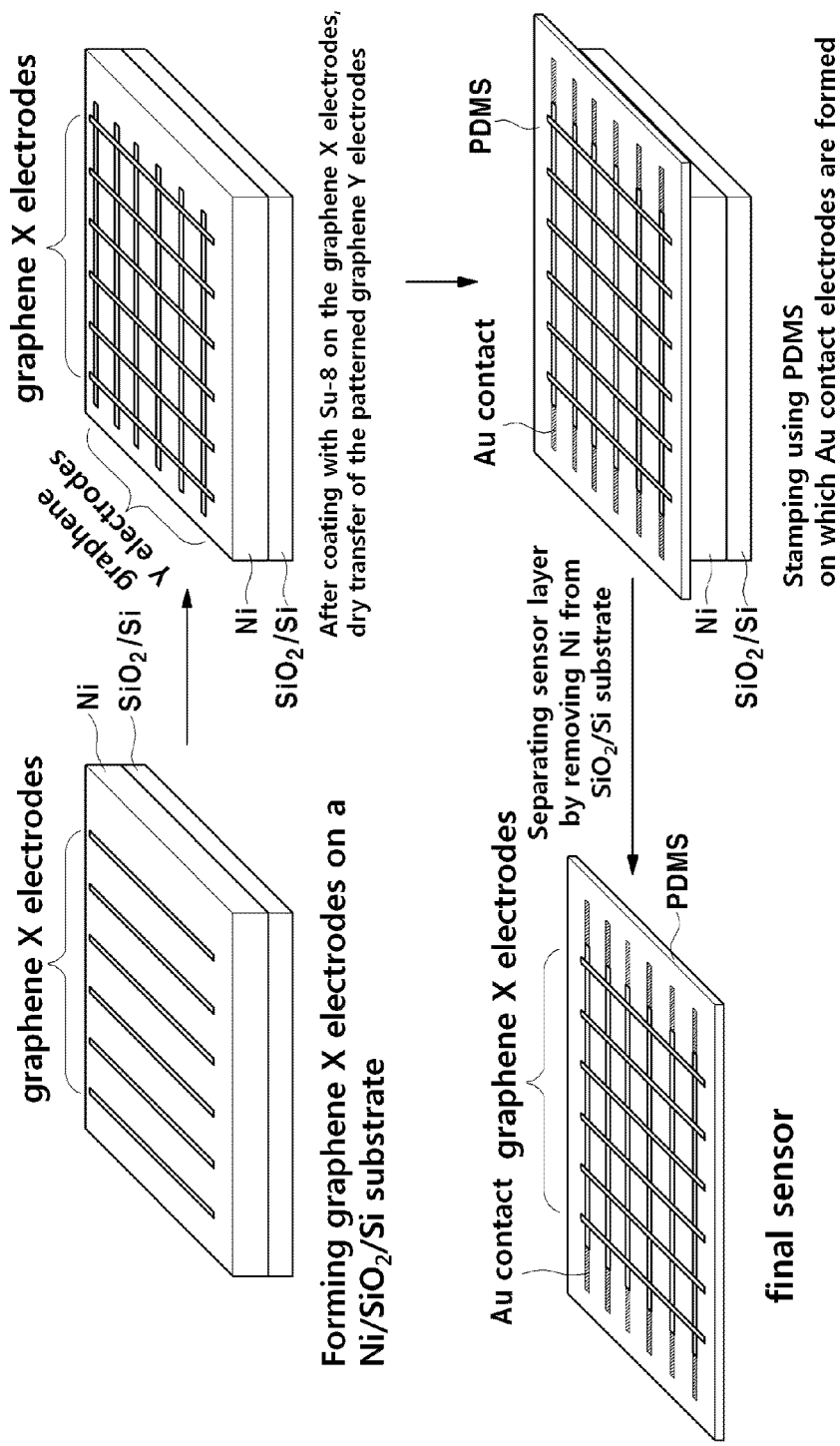
FIG. 3 is a perspective view illustrating a process for manufacturing a touch sensor for simultaneously detecting a pressure and a position in accordance with an example of the present disclosure.

FIG. 2 is an exploded perspective view schematically illustrating the touch sensor for simultaneously detecting a pressure and a position in accordance with an illustrative embodiment of the present disclosure.

With reference to FIG. 2, a touch sensor 200 for simultaneously detecting a pressure and a position in accordance with an illustrative embodiment of the present disclosure may include a first insulating substrate 210, a transparent organic insulator 220, and a second insulating substrate 230. The touch sensor 200 may further include a first substrate formed on the first insulating substrate 210 and including first graphene patterns (X1, X2 . . . Xn) including multiple graphene electrodes formed in parallel with one another, and a second substrate formed on the second insulating substrate 230 and including second graphene patterns (Y1, Y2 . . . Yn) vertically crossing the first graphene patterns and including multiple graphene electrodes formed in parallel with one another.

The first insulating substrate 210 and the second insulating substrate 230 are members, to which an outside pressure (F) by a pointing object (e.g., a finger and a stylus pen) is applied, and strained by the outside pressure (F). In the touch sensor 200 for simultaneously detecting a pressure and a position according to the present disclosure, the first insulating substrate 210 and the second insulating substrate 230 may be formed of a transparent material in order to provide a display screen to a user. For example, the transparent material may include rubber, glass, quartz, an acrylic plate, a transparent film, a plastic substrate, and others. With respect to a material for the upper substrate, a stretchable or elastic substrate may be used such that it can be restored after the outside pressure F of the pointing object is applied. For example, the stretchable or elastic substrate may be selected from the group consisting of thermoplastic elastomer, styrenic materials, olefenic materials, polyolefin, polyurethane thermoplastic elastomers, polyamides, synthetic rubbers, polydimethylsiloxane (PDMS), polybutadiene, polyisobuthylene, poly(styrene-butadiene-styrene), polyurethanes, polychloroprene, silicone, and a combination thereof, but may not be limited thereto.

The first insulating substrate 210 and the second insulating substrate 230 may include a transparent organic insulator 220. For example, the transparent organic insulator 220 may include one selected from the group consisting of thermosetting resins such as polyimide (PI), polyacryl, polyphenol, polyester, silicone and polyurethane, thermoplastic resins such as polycarbonate, polyethylene and polystyrene, benzocyclobutene (BCB), F-added polyimide (PI), perfluorocyclobutane (PFCB), fluoropolyarylether (FPAE), siloxane-based polymers, SOG, and a combination thereof.

Each of the multiple graphene electrodes of the first graphene patterns (X1, X2 . . . Xn) and the second graphene patterns (Y1, Y2 . . . Yn) functions as a strain gauge and is a member for measuring a strain rate of the direction of the contact surface of the first insulating substrate 210 and the second insulating substrate 230, which are strained as the external force F is applied. It is preferable that one surface of the first insulating substrate 210, which is provided with the first graphene patterns (X1, X2 . . . Xn), is facing to the second insulating substrate 230. It is preferable that one surface of the second insulating substrate 230, which is provided with the second graphene patterns (Y1, Y2 . . . Yn), is facing to the first insulating substrate 210. This configuration is to protect the first graphene patterns (X1, X2 . . . Xn) and the second graphene patterns (Y1, Y2 . . . Yn) from the external environment of the touch screen. Since wiring for signal detection in the first graphene patterns (X1, X2 . . . Xn) and the second graphene patterns (Y1, Y2 . . . Yn) is obvious to those skilled in the art, detailed description in this regard is omitted.

In the touch sensor 200 for simultaneously detecting a pressure and a position, when the outer force F is applied, the first insulating substrate 210 is strained. As the first insulating substrate 210 is strained, a resistance value for the first substrate (X1, X2 . . . Xn) formed on the first insulating substrate 210 is changed. From the change of the resistance value, a degree and an operation position of the outside force F can be detected. The change in the resistance is proportional to the degree of the pressure applied by the outside touch. In this case, the function of the graphene strain gauge is to very precisely measure the magnitude of the resistance applied from the outside to a certain area. The graphene strain gauge can more precisely measure the pressure than the resistive type of the multi-touch screen in the first aspect of the present disclosure. In this case, it is also possible to accurately detect a position by plotting distribution of the change in the pressure as well as the pressure applied from the outside on the software. The present disclosure can realize a 3D touch sensor by enumerating the first graphene patterns (X1, X2 . . . Xn) and the second graphene patterns (Y1, Y2 . . . Yn).

Figure 4:
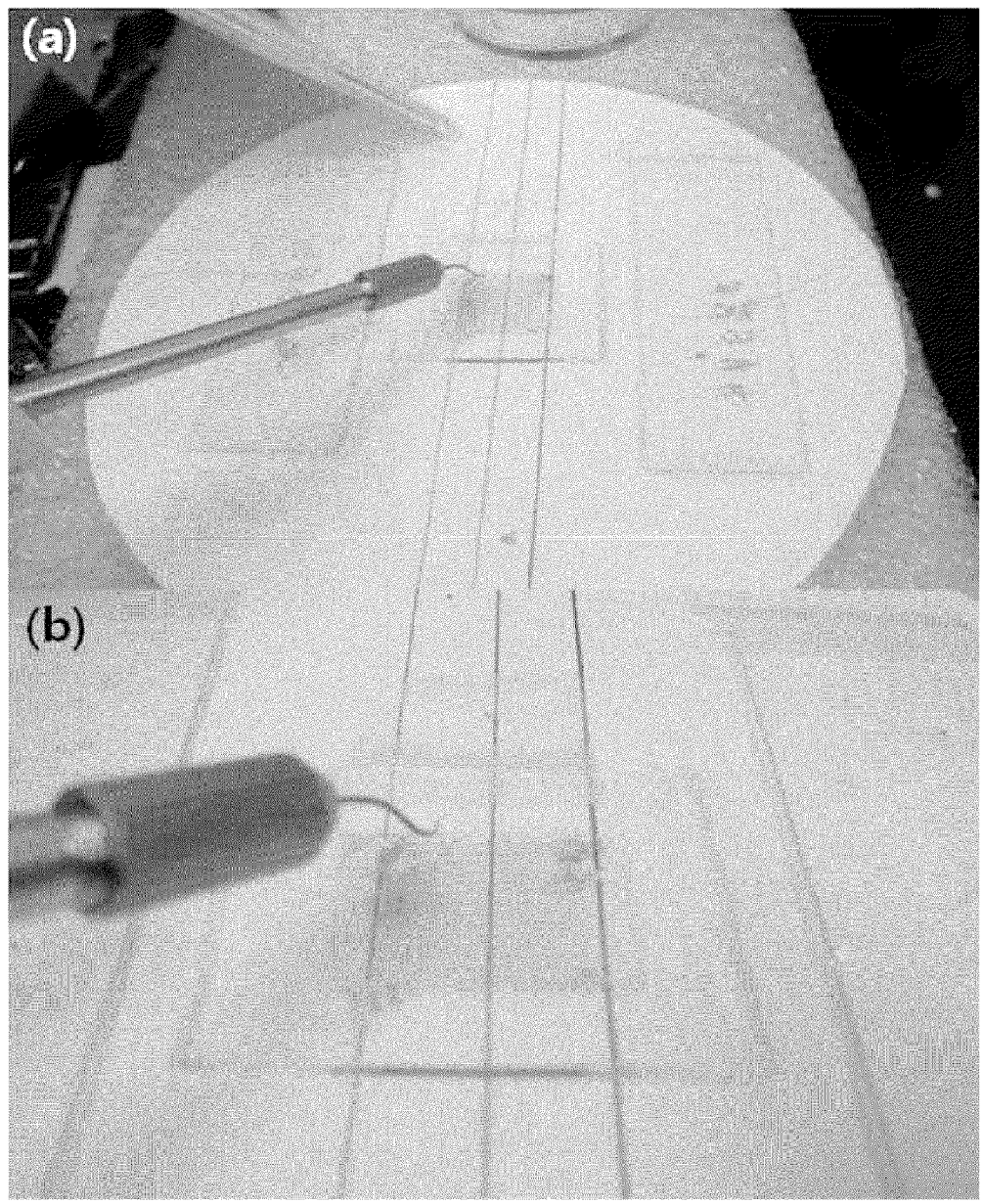
FIG. 4 provides photographs of an experiment process for measuring resistance according to an applied pressure in a touch sensor for simultaneously detecting a pressure and a position in accordance with an example of the present disclosure.
Figure 5:
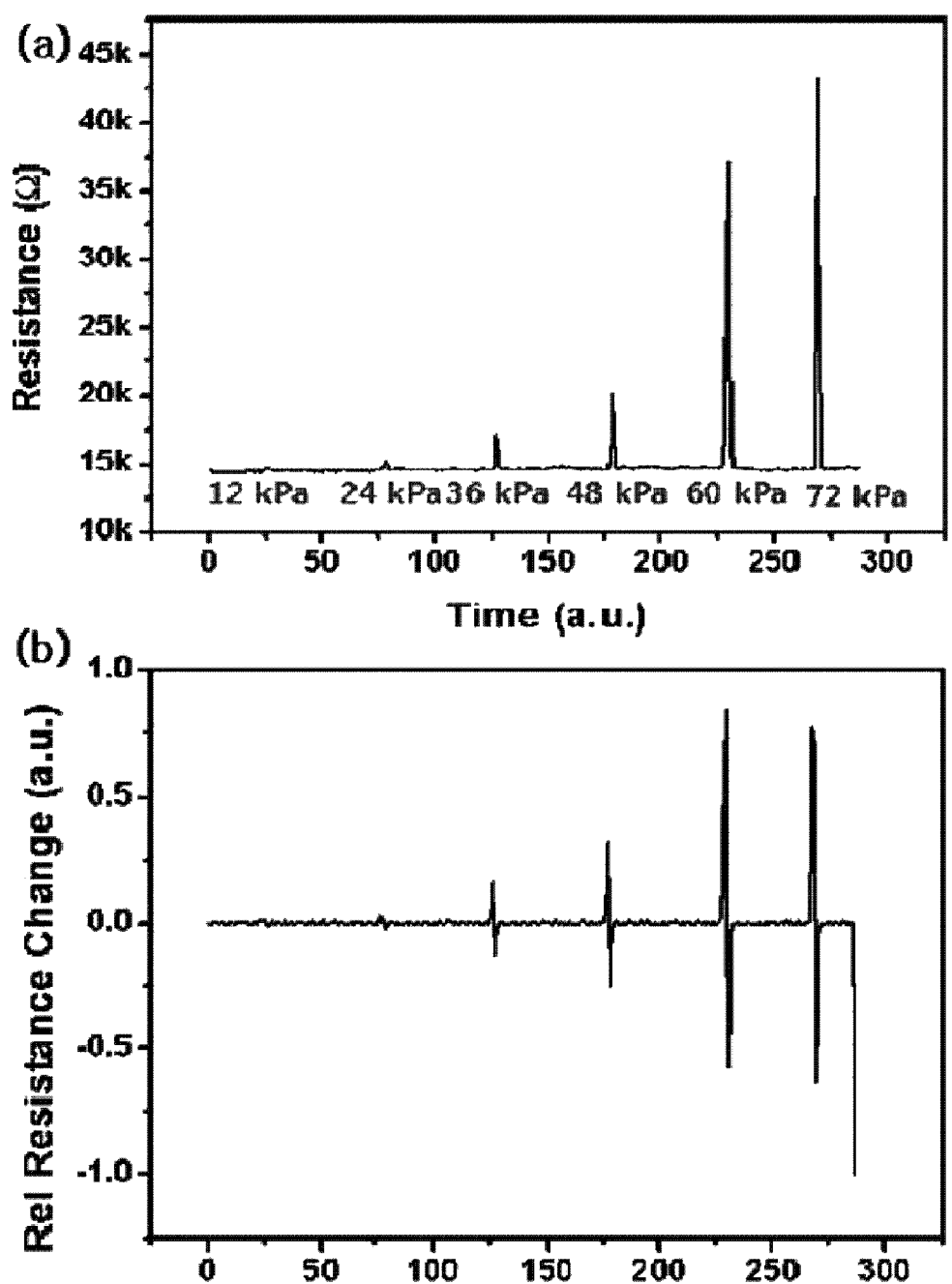
FIG. 5 provides graphs showing change in the resistance, measured by the measuring method of FIG. 4, depending on change in a degree of a pressure as time for applying the pressure changes.
Figure 6:
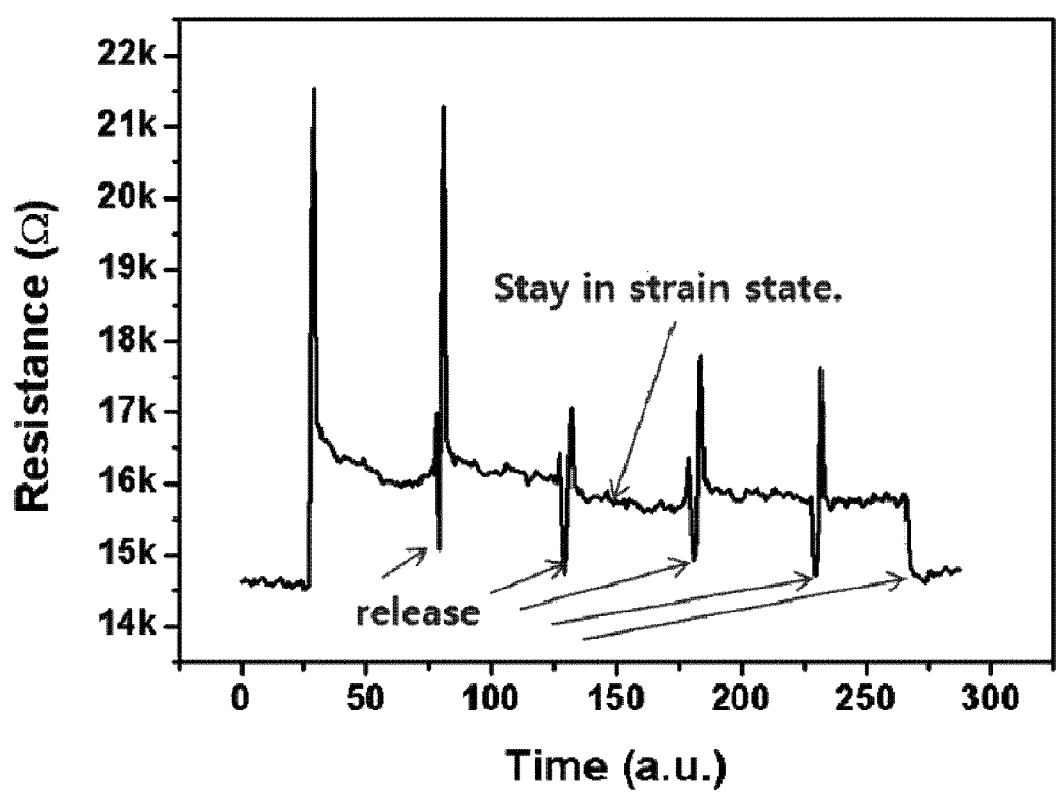
FIG. 6 provides a graph for resistance according to a pressure repeatedly applied to a touch sensor for simultaneously detecting a pressure and a position in accordance with an example of the present disclosure.

In an example (refer to FIG. 3), a Ni layer was formed as a catalyst layer on a $SiO_2$/Si substrate so as to form a Ni/$SiO_2$/Si substrate. Subsequently, graphene was grown on the Ni/$SiO_2$/Si substrate so that graphene X electrode patterns (X1, X2 . . . Xn) were formed on the substrate. Subsequently, after the graphene X electrode patterns (X1, X2 . . . Xn) were coated with 50 nm Su-8 as a transparent organic insulating layer, graphene Y electrode patterns (Y1, Y2 . . . Yn) were patterned in a direction vertical to the graphene X electrode patterns (X1, X2 . . . Xn) and subject to dry transfer. Here, Su-8 functions as a protection layer. Further, since Su-8 is based on epoxy, it facilitates the transfer of the graphene patterns. Subsequently, after gold (Au) was patterned as a contact electrode on a PDMS rubber substrate, the substrate as a whole was put into water to launch the device, and then, remove Ni so that a sensor was manufactured. FIG. 4 provides images of an experiment process for measuring a resistance according to an applied pressure in the touch sensor for simultaneously detecting a pressure and a position in accordance with an example of the present disclosure. FIG. 5 is a graph for the resistance measured by the measuring method of FIG. 4 according to the applied pressure. FIG. 6 is a graph for a resistance according to a repeatedly applied pressure in the touch sensor for simultaneously detecting a pressure and a position in accordance with an example of the present disclosure. With reference to FIGS. 3 to 6, it is observed that in case of the resistance measured as illustrated in the drawings according to the applied pressure, there is a difference in the change of the resistance depending on the magnitude of the applied pressure [(a) of FIG. 5]. In addition, a temporary change in a resistance is clearer when it is converted into a differential value (relative change in a resistance) [(b) of FIG. 5]. When a pressure continues to be applied to the touch sensor, the resistance is maintained in its stretched state according to the magnitude of the applied pressure. When no pressure is applied, the resistance is momentarily restored (FIG. 6). Accordingly, various functions may be added according to the magnitude of the pressure to be applied. For example, the various functions may include a function of adjusting thickness of a character according to the magnitude of the pressure to be applied, and a function of controlling the volume according to the magnitude of the pressure to be applied.

A fourth aspect of the present disclosure can provide a display panel having a touch sensor for simultaneously detecting a pressure and a position, including: a display panel; and a touch sensor for simultaneously detecting a pressure and a position in accordance with the third aspect of the present disclosure, wherein the touch sensor is attached to a front surface of the display panel.

In an illustrative embodiment, the display panel may be a liquid crystal display panel, but may not be limited thereto.

A fifth aspect of the present disclosure can provide a touch sensor for simultaneously detecting a pressure and a position, including: first graphene electrode patterns formed on an insulating substrate and including a plurality of graphene line electrodes formed in parallel with one another, and second graphene electrode patterns formed on the first graphene electrode patterns and including a plurality of graphene line electrodes vertically crossing the respective plurality of the graphene line electrodes of the first graphene electrode patterns and formed in parallel with one another; a plurality of graphene strain gauges formed to be connected to respective crossing points between the plurality of the graphene line electrodes of the first graphene electrode patterns and the plurality of the graphene line electrodes of the second graphene electrode pattern; and a controller that applies a voltage to each of the graphene line electrodes of the first graphene electrode patterns and the second graphene electrode patterns, and senses change in resistance generated in the graphene strain gauges corresponding to a position of an outside touch on the insulating substrate according to a pressure applied by the outside touch to determine X and Y coordinates of the position of the outside touch and senses a degree of the pressure applied by the outside touch.

In an illustrative embodiment, the touch sensor may further include a plurality of thin film transistors connected to each of the plurality of the graphene strain gauges. For example, the plurality of the thin film transistors are connected to the controller, such that when the controller generates voltage, the transistors can be controlled to turn on. Further, the transistors can improve the sensitivity of the touch sensor for simultaneously detecting a pressure and a position In an illustrative embodiment, the multiple thin film transistors may be transparent, but may not be limited thereto. The multiple thin film transistors may be formed of one selected from the group consisting of carbon nanotube, graphenes, organic thin film, thin film oxide, silicone thin film, and a combination thereof, but may not be limited thereto.

In an illustrative embodiment, the insulating substrate may be flexible or stretchable, but may not be limited thereto.

In an illustrative embodiment, the touch sensor may further include protection layers on the second graphene electrode patterns and the graphene strain gauges, but may not be limited thereto.

Figure 7:
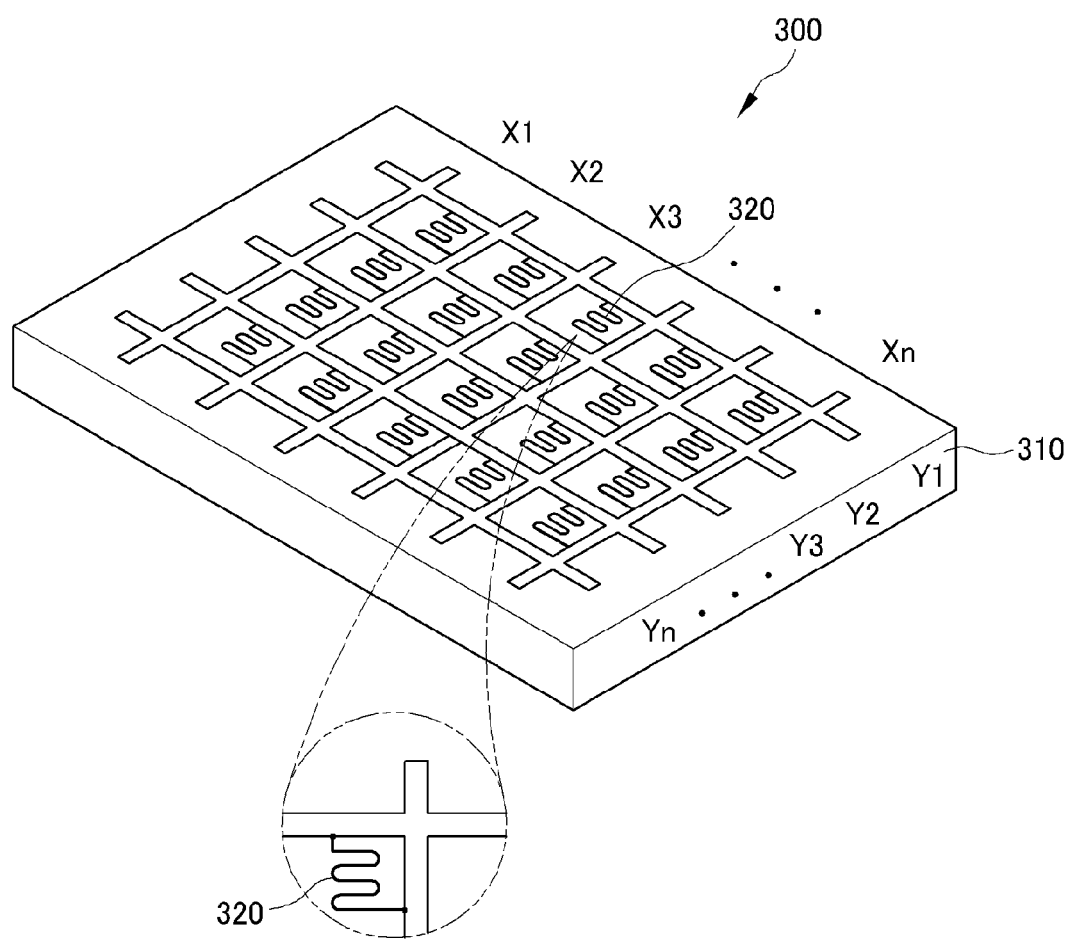
FIG. 7 is an exploded perspective view schematically illustrating a touch sensor for simultaneously detecting a pressure and a position in accordance with another illustrative embodiment of the present disclosure.

FIG. 7 is an exploded perspective view schematically illustrating the touch sensor for simultaneously detecting a pressure and a position by using change in resistance in accordance with an illustrative embodiment of the present disclosure. With reference to FIG. 7, a touch sensor 300 for simultaneously detecting a pressure and a position in an illustrative embodiment of the present disclosure may include first graphene electrode patterns (X1, X2 . . . Xn) formed on an insulating substrate 310, second graphene electrode patterns (Y1, Y2 . . . Yn), graphene strain gauges 320, and a controller (not illustrated). The touch sensor 300 may further include protection layers (not illustrated) on the first graphene electrode patterns (X1, X2 . . . Xn), the second graphene electrode patterns (Y1, Y2 . . . Yn), and the graphene strain gauges.

When a voltage is applied to the first graphene electrode patterns (X1, X2 . . . Xn) and the second graphene electrode patterns (Y1, Y2 . . . Yn), an electric field is formed in the first graphene electrode patterns (X1, X2 . . . Xn) and the second graphene electrode patterns (Y1, Y2 . . . Yn). A strain rate in the direction of the contact surface of the insulating substrate strained according to the application of the outside pressure can be measured by the strain gauges 320 connected to the crossing points of the first graphene electrode patterns (X1, X2 . . . Xn) and the second graphene electrode patterns (Y1, Y2 . . . Yn). As illustrated in the enlarged view, since the electric resistance is changed in proportion to the change of the length of the strain gauges 320, the strain gauges 320 in a winding form can be more sensitive to the outside pressure. The strain gauges 320 are formed of graphene, such that a resistance value is changed according to a degree of the force applied to the touch sensor 300 for simultaneously detecting a pressure and a position. As a result, the degree of the force applied to the outside touch position can be measured.

Figure 8:
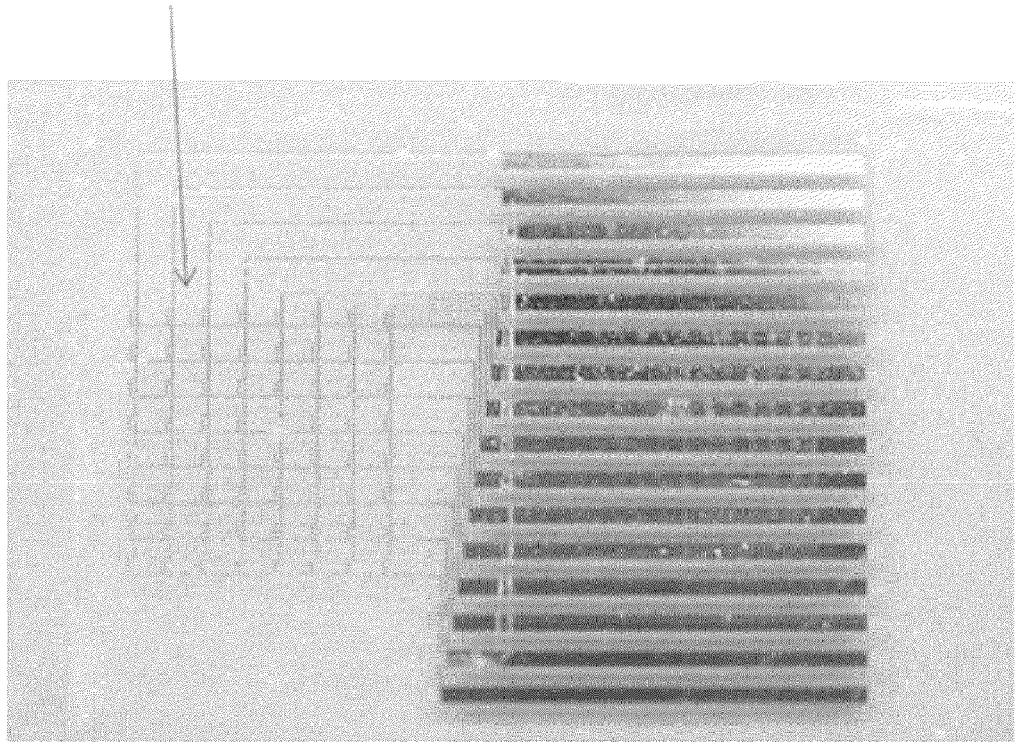
FIG. 8 provides a photograph of a touch sensor for simultaneously detecting a pressure and a position, which is manufactured including a graphene strain gauge, in accordance with an example of the present disclosure.

FIG. 8 provides a photograph of the touch sensor for simultaneously detecting a pressure and a position including the graphene strain gauges in accordance with an example of the present disclosure. In an example of the present disclosure, the touch sensor for simultaneously detecting a pressure and a position including the graphene electrodes and the graphene strain gauges may have a monolayer structure formed by patterning one graphene sheet. For example, the graphene sheet may be produced by growing graphene on a metal catalyst layer. The metal catalyst layer is used to facilitate the growth of the graphene. With respect to materials for the metal catalyst layer, any materials can be used without limitation. For example, the metal catalyst layer may include one selected from the group consisting of Ni, Co, Fe, Pt, Au, Al, Cr, Cu, Mg, Mn, Mo, Rh, Si, Ta, Ti, W, U, V, Zr, Ge, Ru, Ir, brass, bronze, nickel, stainless steel, and a combination thereof, but may not be limited thereto.

With respect to the method for growing graphene, any method generally used in the art to grow graphene may be used without limitation. For example, the method for growing the graphene may use a chemical vapour deposition (CVD) method, but may not be limited thereto. The chemical vapour deposition method may include rapid thermal chemical vapour deposition (RTCVD), inductively coupled plasma-chemical vapor deposition (ICP-CVD), low pressure chemical vapor deposition (LPCVD), an atmospheric pressure chemical vapor deposition (APCVD), metal organic chemical vapor deposition (MOCVD), and plasma-enhanced chemical vapor deposition (PECVD), but may not be limited thereto.

The graphene can be grown by applying a vapor carbon supply source to the metal catalyst layer and performing heat treatment for the metal catalyst layer. In an illustrative embodiment, the metal catalyst layer is put into a chamber, and then while vaporously injecting a carbon supply source such as carbon monoxide, ethane, ethylene, ethanol, acetylene, propane, butane, butadiene, pentane, pentene, cyclopentadiene, hexane, cyclohexane, benzene, or toluene into the chamber, heat treatment is performed, for example, at a temperature of about 300° C. to 2000° C. As a result, carbon components existing in the carbon supply source are bonded to one another to form a hexagonal plate shape structure so that graphene is generated. When the graphene is cooled, the graphene in a uniformed arrangement state is obtained. However, the method for forming graphene on the metal catalyst layer may not be limited to the chemical vapor deposition method. In an illustrative embodiment of the present disclosure, any method that forms graphene on the metal catalyst layer may be used. It is understood that the present disclosure may not be limited to the certain method that forms graphene on the metal catalyst layer.

After growing the graphene on the metal catalyst layer, the graphene can be transferred to a desired target substrate. The target substrate is a flexible and stretchable substrate like PDMS, PET or others. It is possible to simultaneously pattern, on the substrate, the X graphene electrode patterns (X1, X2 ... Xn), the Y graphene electrode patterns (Y1, Y2 ... Yn), and the strain gauges through an oxygen plasma process using photolithography, a shadow mask, or others. The touch sensor for simultaneously detecting a pressure and a position can also be manufactured through the process for transferring the graphene, in which the X graphene electrode patterns (X1, X2 ... Xn), the Y graphene electrode patterns (Y1, Y2 ... Yn), and the strain gauges have already been patterned on the metal catalyst layer, to the desired target substrate.

The touch sensor may further include multiple thin film transistors (not illustrated) included in the graphene strain gauges 300. The multiple thin film transistors are connected to the controller (not illustrated), such that when the controller generates voltage, the transistors can be controlled to turn on.

The multiple thin film transistors may be transparent. For example, the multiple thin film transistors may include one selected from the group consisting of carbon nanotube, graphene, organic thin film, thin film oxide, silicon thin film, and a combination thereof, but may not be limited thereto.

A sixth aspect of the present disclosure can provide a display panel having a touch sensor for simultaneously detecting a pressure and a position, including: a display panel; and a touch sensor for simultaneously detecting a pressure and a position in accordance with the fifth aspect of the present disclosure, wherein the touch sensor is attached to a front surface of the display panel.

In an illustrative embodiment, the display panel may be a liquid crystal display panel, but may not be limited thereto.

Figure 9:
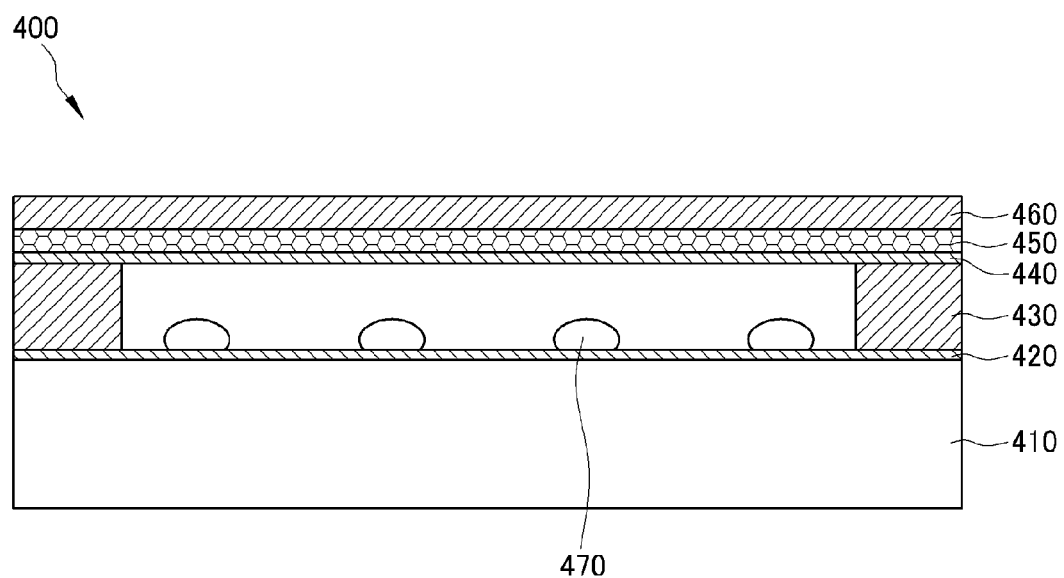
FIG. 9 is a cross-sectional view schematically illustrating a touch sensor for simultaneously detecting a pressure and a position in accordance with an illustrative embodiment of the present disclosure.

As illustrated in FIG. 9, a seventh aspect of the present disclosure can provide a touch sensor 400 for simultaneously detecting a pressure and a position, including: a lower substrate 410 provided with a transparent conductive film 420, an electrode and dot spacers 470; an upper substrate 460 provided with a transparent conductive film 440 and an electrode; a graphene electrode 450 formed on the electrode included in the upper substrate 460 and/or the electrode included in the lower substrate 410 and having a function of sensing strain; and an adhesive 430 for adhering the lower substrate 410 and the upper substrate 460 to be facing to each other with a certain interval.

The transparent conductive films 420 and 440 are formed of a transparent material. For example, the transparent conductive films 420 and 440 may be formed of material including transparent conductive oxide (TCO) such as indium tin oxide (ITO), indium zinc oxide (IZO), tin antinomy oxide (TAO), tin oxide (TO), zinc oxide (ZnO), carbon nanotube, or graphene. The touch sensor 400 uses a resistive type, in which when an outside pressure is applied onto the upper substrate 460, the transparent conductive films 420 and 440 of the upper substrate 460 and the lower substrate 410 are in mechanical contact with each other such that X axis and Y axis potentials formed on the contact point of each of the counterpart substrates are sensed, and thus, a position can be sensed by means of the potential value. The structure of the resistive type of the touch sensor may vary within the scope of those skilled in the art.

Figure 10:
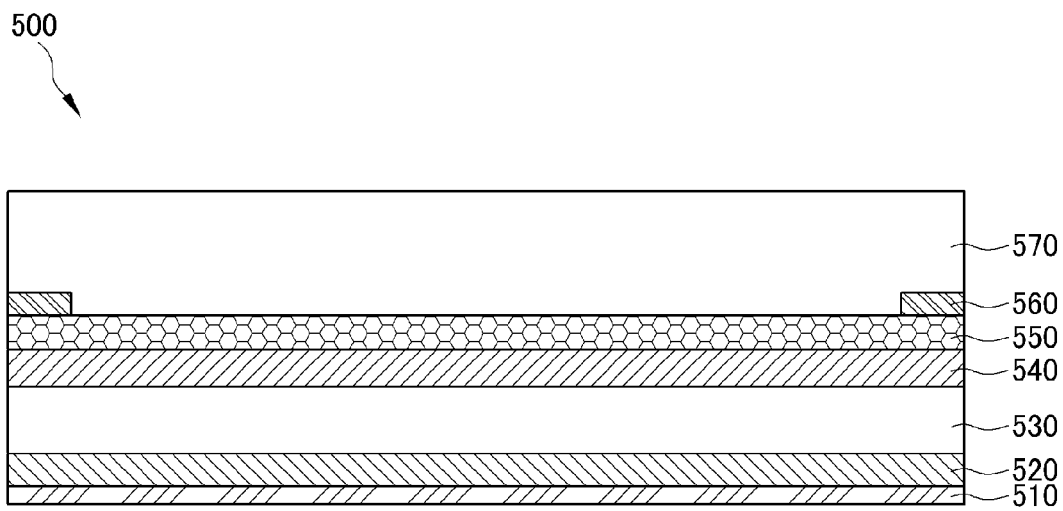
FIG. 10 is a cross-sectional view schematically illustrating a touch sensor for simultaneously detecting a pressure and a position in accordance with another illustrative embodiment of the present disclosure.

As illustrated in FIG. 10, an eighth aspect of the present disclosure can provide a touch sensor 500 for simultaneously detecting a pressure and a position, including an upper substrate 570 provided with a transparent conductive film 540, a lower substrate 530 provided with a transparent conductive film 520, a graphene electrode 550 formed between the upper substrate 570 and the transparent conductive film 540, an electrode 560 formed on a side surface of the graphene electrode 550, and an insulating coating portion 510 for insulating a lower part of the transparent conductive film 540, wherein when the top surface of the transparent conductive film is touched, the touch position is sensed by the electrode formed on the side surface according to variation of electrostatic capacitance, and a degree of the pressure by the touch is sensed by using the function of the graphene electrode itself to sense strain.

The upper substrate 570 may be formed of glass or plastic. For the lower substrate 530, a polymer film substrate may be used. The transparent conductive films 520 and 540 formed on the upper substrate 570 and the lower substrate 530 are formed of transparent materials. For example, the transparent conductive films 520 and 540 may be formed of material including transparent conductive oxide (TCO) such as indium tin oxide (ITO), indium zinc oxide (IZO), tin antinomy oxide (TAO), tin oxide (TO), zinc oxide (ZnO), carbon nanotube, or graphene.

The touch sensor 500 uses the capacitive type, in which when a conductor such as a finger of a person or a conductive stylus pen touches the top portion of the transparent conductive film, voltage drop occurs such that the electrode provided on the side surface sense the touch position. The structure of the capacitive type of the touch sensor may vary within the scope of those skilled in the art.

The graphene strain sensors 450 and 550 formed on the transparent conductive films in the touch sensor using the resistive type 400 and the capacitive type 500 can also measure a pressure by evaluating a degree of the applied pressure by means of a degree of current depression caused by resistance change of graphene resulting from an outside pressure. Accordingly, it is possible to provide a touch sensor for simultaneously measuring a pressure and a position.

The present disclosure has been described in detail with reference to embodiments and examples. However, the present disclosure may not be limited to the embodiments and the examples and may be modified in various forms. It is clear that various modifications to the present disclosure may be made by one of ordinary skill in the art within the technical concept of the present disclosure.

What is claimed is:

1. A touch sensor for simultaneously detecting a pressure and a position, comprising:

first graphene electrode patterns formed on an insulating substrate and comprising a plurality of graphene line electrodes formed in parallel with one another, and second graphene electrode patterns formed on the first graphene electrode patterns and comprising a plurality of graphene line electrodes vertically crossing the respective plurality of the graphene line electrodes of the first graphene electrode patterns and formed in parallel with one another;

a plurality of graphene strain gauges formed to be connected to respective crossing points between the plurality of the graphene line electrodes of the first graphene electrode patterns and the plurality of the graphene line electrodes of the second graphene electrode patterns; and a controller that applies a voltage to each of the graphene line electrodes of the first graphene electrode patterns and the second graphene electrode patterns, and senses a change in resistance generated in the graphene strain gauges corresponding to a position of an outside touch on the insulating substrate according to a pressure applied by the outside touch to determine X and Y coordinates of the position of the outside touch and senses a degree of the pressure applied by the outside touch.

2. The touch sensor for simultaneously detecting a pressure and a position as claimed in claim 1,
wherein the touch sensor further includes a plurality of thin film transistors(TFTs) connected to each of the plurality of the graphene strain gauges.

3. The touch sensor for simultaneously detecting a pressure and a position as claimed in claim 2,
wherein the plurality of the thin film transistors are connected to the controller such that when the controller applies a voltage, the thin film transistors are controlled to turn on.

4. The touch sensor for simultaneously detecting a pressure and a position as claimed in claim 2,
wherein the plurality of the thin film transistors are formed of one selected from the group consisting of carbon nanotube, graphene, organic thin film, thin film oxide, silicone thin film, and a combination thereof.

5. The touch sensor for simultaneously detecting a pressure and a position as claimed in claim 1,
wherein the touch sensor further includes a protection layer on the second graphene electrode patterns and the graphene strain gauges.

6. A display panel configured to detect an outside touch, comprising:
a front surface;
a touch sensor for simultaneously detecting a pressure and a position according to claim 1, attached to the front surface.

* * * * *